(12) United States Patent
Ardanuc et al.

(10) Patent No.: US 12,212,870 B2
(45) Date of Patent: Jan. 28, 2025

(54) MONOLITHIC, MULTI-MODE, CMOS-COMPATIBLE IMAGER WITH ACTIVE, PER-PIXEL DRIVE AND SENSE CIRCUITRY FOR TRANSDUCERS

(71) Applicant: Geegah LLC, Ithaca, NY (US)

(72) Inventors: Serhan Ardanuc, Ithaca, NY (US); Justin Kuo, Ithaca, NY (US); Amit Lal, Ithaca, NY (US)

(73) Assignee: Geegah LLC, Ithaca, NY (US)

( * ) Notice: Subject to any disclaimer, the term of this patent is extended or adjusted under 35 U.S.C. 154(b) by 80 days.

(21) Appl. No.: 18/140,995

(22) Filed: Apr. 28, 2023

(65) Prior Publication Data

US 2023/0353903 A1    Nov. 2, 2023

Related U.S. Application Data

(60) Provisional application No. 63/336,444, filed on Apr. 29, 2022.

(51) Int. Cl.
| | | |
|---|---|---|
| H04N 25/77 | (2023.01) | |
| H01L 27/146 | (2006.01) | |
| H04N 23/11 | (2023.01) | |
| H04N 23/12 | (2023.01) | |
| H04N 23/56 | (2023.01) | |

(52) U.S. Cl.
CPC ....... *H04N 25/77* (2023.01); *H01L 27/14609* (2013.01); *H01L 27/14643* (2013.01); *H04N 23/11* (2023.01); *H04N 23/12* (2023.01); *H04N 23/56* (2023.01)

(58) Field of Classification Search
CPC ........ H04N 25/77; H04N 23/12; H04N 23/56; H04N 23/11
USPC ....................................................... 348/163
See application file for complete search history.

(56) References Cited

U.S. PATENT DOCUMENTS

2012/0147698 A1* 6/2012 Wong ....................... B60B 1/02
367/87

* cited by examiner

*Primary Examiner* — Nguyen T Truong
(74) *Attorney, Agent, or Firm* — Bond, Shoeneck & King, PLLC; George R. McGuire

(57) ABSTRACT

A single-chip solution for multi-modal imaging with every pixel capable of electrostatic, ultrasonic and optical imaging. The device can be configured in as much modality configurations as possible based on the types of the transducers included in the system.

16 Claims, 9 Drawing Sheets

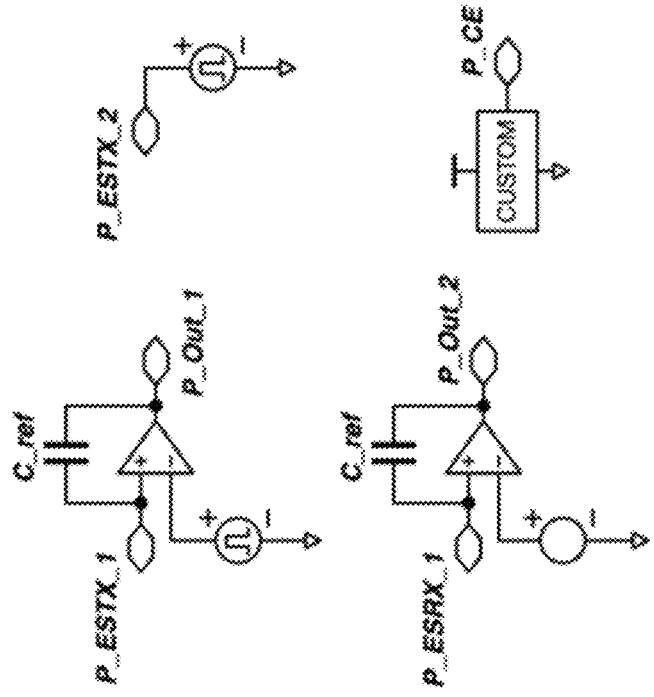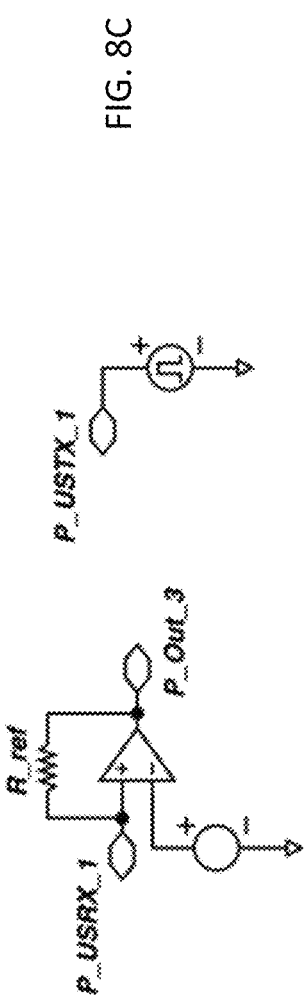

MONOLITHIC, MULTI-MODE, CMOS-COMPATIBLE IMAGER WITH ACTIVE, PER-PIXEL DRIVE AND SENSE CIRCUITRY FOR TRANSDUCERS

CROSS-REFERENCE TO RELATED APPLICATION

This application claims priority to U.S. Provisional Patent Application Ser. No. 63/336,444, filed on Apr. 29, 2022, and entitled "A MONOLITHIC, MULTI-MODE, CMOS-COMPATIBLE IMAGER WITH ACTIVE, PER-PIXEL DRIVE AND SENSE CIRCUITRY FOR TRANSDUCERS," the entire disclosure of which is incorporated herein by reference.

GOVERNMENT FUNDING

N/A

FIELD OF THE INVENTION

A large number of imaging applications used in biology, precision agriculture, quality/defect-monitoring, and thermal imaging favor solutions that can improve the scope of the acquired data with minimal increase in the cost and size of the imager. Point of care lab-on-chip devices for fast diagnosis, fingerprint scanners, CMOS imagers used in cell-phones, fluorescent microscopy, medical ultrasound imagers, scanning acoustic microscopes used in electronics manufacturing, and imagers used in agriculture for soil and crop management are some example applications.

While increasing the area of the imaged surface/volume is a way of increasing the scope of the data, a much higher value lies in using multi-modal imaging, which uses a single imaging-system and a combination of two or more of the imaging domains to acquire information about optical, capacitive, acoustic, thermal, chemical (e.g. PH sensor, gas type, charge density imaging), and magnetic/electromagnetic (THz Imaging, mm-wave short range radar) properties, to name some common ones.

Using imagers of different types on different chips or products and operating them sequentially on the same area/volume of the sample achieves multi-modality. However, such an approach incurs registration errors among different modalities, requires potential mechanical translation/rotation to switch between different imagers to get data from the same side/part of the sample. Any such mechanical motion or rotation can be a huge impediment against high-resolution imaging. Furthermore, sequential imaging prevents fast, simultaneous data acquisition.

Replication of similar (and costly) readout/scan electronics among imagers of different modality is another shortcoming, making multi-chip approach to multi-modal imaging a poor choice for low cost and compact solutions. To make things worse, with different chips dedicated to different domains, one cannot achieve simultaneous sensing from two domains and also be equidistant from the imaged area for every pixel of the image. This usually means that the sensing domain closest to the area being imaged will get favorable sensitivity during cross-domain imaging, i.e. exciting in one domain and sensing in another. These factors can yield to non-uniformities due to phenomena such as loss, diffraction and scattering. While they can be corrected in post-processing up to an extent, it will negatively affect the power and cost budget.

Different types of multi-modal imaging systems have been realized both for research and industrial applications. Table 1 shows a few examples of multimodal imagers with optical, ultrasound and (electrical) potential imaging capabilities.

TABLE 1

Examples of multimodal imagers

| Reference | Modalities | Notes |
| --- | --- | --- |
| [Mela21] | Ultrasound-fluorescence | Real-time embedded augmented reality (AR) for displaying images |
| [Mezil20] | Photoacoustic-fluorescent | Fiber optic ultrasound sensor in combination with pulsed laser |
| [Laudereau15] | Acousto-optic | Acousto-optical contrast was enhanced compared to pure-acoustic imaging approaches for detection of liver tumors |
| [Tokuda06] | Optical and electrical potential | 1.6 mV resolution in potential sensing |
| [Huang14, Huang15] | Optical-electrochemical | PH sensitivity of 103.8 mV/pH |

Due to the invaluable information it provides, easy implementation with CCD and CMOS imagers, non-invasive, and non-ionizing nature, optical imaging is arguably the most common mode in multi-modal imagers. Unfortunately, optics used in traditional microscopy is also bulky. As such, the key to miniaturizing optics relies on getting rid of the conventional free-space optical components such as lenses, beam splitters, and mirrors. This is the main motivation behind recent advances in lensless imaging solutions. Compact systems and short sample to imager gaps are achievable with lensless shadow imaging, which often relies on imaging samples directly on top of a CMOS imager die, sometimes using pixel-level masks to create well defined pinholes. Furthermore, large objects can be imaged by arranging a micro-fluidic channel on top of the imager and flowing it through the channel to image different parts of the sample. A well-suited application for lensless shadow imaging is cytometry (counting of cells) from optical images.

In addition to lensless shadow imaging of biological samples and cell counting, CMOS imagers find use in a large spectrum of biomedical and wireless/portable applications such as medical implants, endoscopy probes, IoT sensor nodes, and surveillance cameras. Minimal power consumption (compared to CCD), wide availability of different pixel sizes at different technology node/cost points, large number of target applications and companies producing them only contribute to the ubiquity of CMOS imagers.

Photoacoustic [Beard11, Steinberg19] and acousto-optic [Laudereau15, Yao2000] are powerful multi-modal imaging techniques that exploit the interplay between mechanical and optical domains. In the case of photoacoustic (optoacoustic) imaging, an ultrasound image is generated based on the optical absorption characteristics of the sample [Beard11]. In the case of acousto-optic imaging, the ultrasound-modulates part of the incoming light at the ultrasonic excitation frequency and permits tomographic imaging of biological tissues by scanning using a modulated light at the same frequency [Yao2000]. Furthermore, due to differences in optical and acoustic wavelength, absorption, and scattering characteristics, it is possible to image deeper into the tissue using a hybrid approach as opposed to an optical-only approach. Both photo acoustic and acousto-optic imaging have applications in medical research and basic biology for studying cancer, cardiovascular disease, abnormalities of the microcirculation, and other conditions [Beard11, Laudereau15].

Clearly, there is a great incentive to have multi-modal imagers so that scientists can create multi-dimensional datasets with cross-domain characteristic coupling coefficients of their samples as well as coefficients in a single-domain. Discarding mechanical scanners to perform these complex imaging tasks and supporting sub-micron registration between multiple modalities with high frame-rates call for monolithic, system-on-chip (SOC) solutions using an array of high-density transducers. Although this imposes a challenging system-design problem, with inherent circuit-design, basic-physics, and fabrication aspects, SoC multi-mode imagers can democratize complex imaging and characterization tasks offering a high-potential for scientific impact. Here, we disclose multiple embodiments of ultrasonic, electrical, optical, and thermal multi-mode imagers that can serve this purpose.

SUMMARY

The present disclosure is directed to a monolithic, multi-mode, CMOS-compatible imager with active, per-pixel drive and sense circuitry for transducers.

According to an aspect is a device, comprising a substrate and a focal plane array of pixels, wherein pixels comprise one or more transducers in one or more of the ultrasonic, electrical, optical, and thermal domains, wherein ultrasonic transducers are adapted to perform one or more of the following functions: ultrasonic transmit, ultrasonic receive, electrical transmit, electrical receive, GND electrode, by connecting their electrodes to relevant circuits using electrical switches, wherein the pixels are implemented using a complementary metal oxide semiconductor (CMOS) process, wherein the top of the substrate includes CMOS electronics, wherein optical transducer consists of one or more of a photodetector element using a semiconductor junction, or an array thereof, or a light source incident on top of the substrate, or a light source incident from the bottom of the substrate, wherein thermal transducers on the pixel consist of a temperature sensor and a local heater element.

According to an embodiment, the substrate is made of silicon, glass, sapphire or other semiconductor materials.

According to an embodiment, the ultrasonic transducer can be used to have ultrasonic image of the sample According to an embodiment, the electrical transmit and receive circuits can be used to have the electrical impedance and capacitive image of the sample According to an embodiment, the device is adapted to image the samples on the top side of the substrate in a manner where transmit and receive modalities are each picked from one or more of the following: ultrasonic, electrical, optical, thermal.

According to an embodiment, the device is adapted to image the samples on the bottom side of the substrate in a manner where transmit and receive modalities are each picked from one or more of the following: ultrasonic, optical, thermal.

According to an embodiment, the samples can be placed on top of the substrate by temporarily removing or folding the top light source According to an embodiment, the collected data can be transferred to other electronic peripherals or to a central controller wirelessly or using wires According to an embodiment, any external light source or any of the pixel transducers and their configuration can be controlled from a central unit either on the device, or off the device.

According to an embodiment, the ultrasonic transducer electrodes are shared with electrical and capacitive transduction electrodes to allow tighter integration within the pixel or plurality of pixels.

According to an embodiment, a sample can be viewed from a camera on the bottom side of the substrate facing the sample.

According to an embodiment, a second substrate made of an optically transparent material is bonded on the back side of the substrate.

According to an embodiment, the optical output of the LED lights couple to the second substrate of transparent nature and is transmitted to the sample to image it.

According to an aspect is an apparatus, comprising a substrate and first and second focal plane arrays of pixels, wherein in each array of pixels: pixels comprise one or more transducers in one or more of the ultrasonic, electrical, optical, and thermal domains, ultrasonic transducers are adapted to perform at least one of the following functions by connecting their electrodes to relevant circuits using electrical switches: ultrasonic transmit, ultrasonic receive, electrical transmit, electrical receive, GND electrode, by connecting their electrodes to relevant circuits using electrical switches, the pixels are implemented using a complementary metal oxide semiconductor (CMOS) process, the top of the substrate includes CMOS electronics, optical transducer consists of one or more of a photodetector element using a semiconductor junction, or an array thereof, or a light source incident on top of the substrate, or a light source incident from the bottom of the substrate, wherein thermal transducers on the pixel consist of a temperature sensor and a local heater element, wherein, the first and second focal array of pixels are positioned on top of each other facing their imaging surfaces against each other with an adjustable gap that can be used to adjust the normal force applied to any sample to be imaged in between the two devices.

According to an embodiment, all the pixels and the modality of transducers can be controlled from a single controller on or off the apparatus.

According to an embodiment, the collected sensor data can be transferred to other electronic peripherals or to a central controller wirelessly or using wires.

These and other aspects of the invention will be apparent from the embodiments described below.

BRIEF DESCRIPTION OF THE DRAWINGS

The present invention will be more fully understood and appreciated by reading the following Detailed Description in conjunction with the accompanying drawings, in which:

FIGS. 8A-8C are schematics of sample circuits for US and ES TX/RX circuits that can be used with the architecture, in accordance with an embodiment.

DETAILED DESCRIPTION OF EMBODIMENTS

The present disclosure describes a monolithic, multi-mode, CMOS-compatible imager with active, per-pixel drive and sense circuitry for transducers.

The First Embodiment

A single-chip solution for multi-modal imaging with every pixel capable of electrostatic, ultrasonic and optical imaging. Note that the approach does not merely come from summing different modalities, but by making each modality work efficiently with and/or without each other, simultaneously or in a time-multiplexed manner to also support cross-domain imaging if desired. Further, standard motivational aspects of microsystems such as small size, weight, area, low-power and low cost (SWAP-C) are fully valid.

An overarching goal is to realize a system that can be configured in as much modality configurations as possible based on the types of the transducers included in the system. For instance, if the number of modalities is $N_{mode}=4$, one should be able to operate in $N_{mode}^2=16$ for single transmit (TX) and single receive (RX) mode of operations. Purely ultrasonic imaging would correspond to ultrasonic TX and RX, and purely optical operation entails optical TX and RX. Picking different operating modes for TX and RX enables cross domain imaging such as acousto-optic imaging with US as TX and optical as RX [Laudereau15], photo-acoustic microscopy [Beard11, Steinberg19] with optics as TX and US as RX. Other example applications are fluorescence imaging, [Mezil20], dielectrostriction measurements, thermal microcalorimetry, thermal imaging of (light-induced) chemical reactions, acoustic heating etc. It might also be possible to operate in 1 TX-2TX modes in certain scenarios, but this would complicate the system design more than potentially improving the scan speed. Sequential TX-RX of imaging modality pairs is therefore the preferred approach.

Figure 1:
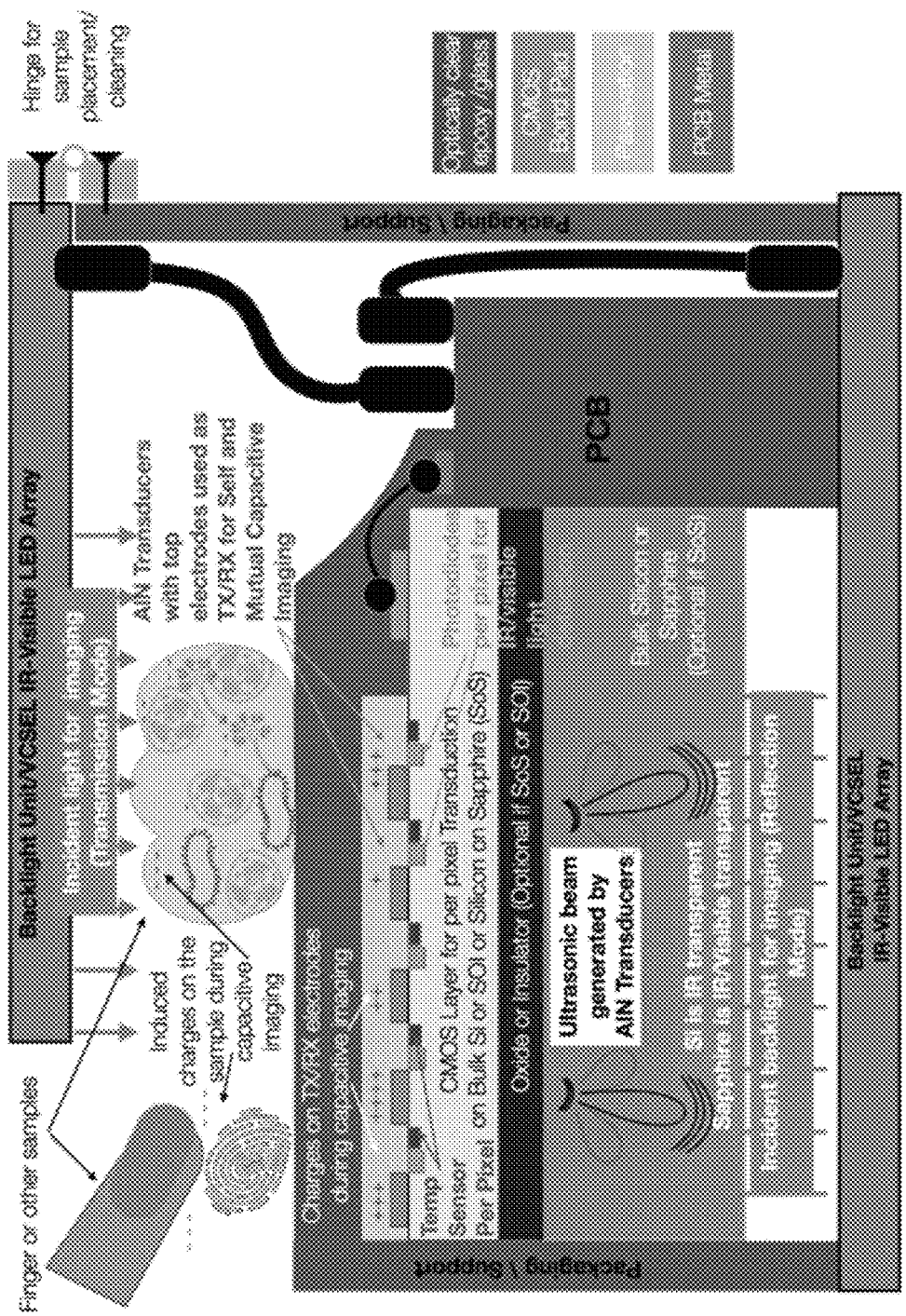
FIG. 1 is a schematic depiction of the main parts of an acoustic-optical-capacitive/electrical-thermal multi-mode imager, in accordance with an embodiment.

The main parts of the proposed device are pictured in FIG. 1. The core sensing surface of the system, which is the CMOS die surface on top, is designed to be close to the sample being imaged to have a global maximum of sensitivity considering all the modalities. Every pixel depicted has four modality of transduction as detailed in the following sections.

Ultrasonic Transduction

Using CMOS compatible piezoelectric materials such as AlN, one can realize either solidly mounted [Kuo21, Abdelmejeed19] or released Piezoelectric Micromachined Ultrasonic Transducers (PMUT). One can also implement released actuators using Capacitive Micromachined Ultrasonic Transducers (CMUTs), unless using relatively large DC Voltages is a concern.

In the embodiment described here, AlN is chosen due to its CMOS compatibility, high transduction efficiency, and low voltage operation. Each sensor is designed to operate in the thickness mode, which can be modeled relatively accurately using transmission line based Mason, Redwood or KLM models [Cobbold06:Ch6]. These models can guide the material choice along the acoustic path and in the piezoelectric stack up to keep the acoustic loss to a minimum.

In the first embodiment shown in FIG. 1, the ultrasonic sensing is done on the same side as the CMOS side unlike previous approaches [Kuo21, Abdelmejeed19, Hoople14] from Geegah and SonicMEMS Group @ Cornell University. This is to improve the sensitivity and can be proved using simulations. The shortcoming is that the CMOS side is exposed to hazard of wear and tear over repeated use, change of samples and cleaning in between. It should be noted however, CMOS side sensing is done routinely in capacitive fingerprint sensors; and millions of units are in use by customers for more than a decade now. In other words, this is a solved problem in microelectronics packaging.

There may be cases that warrant imaging on the backside. The extra packaging layer on the top side can increase the z-profile height of the overall system, and repeated exposure to chemical solutions may reduce the lifetime of the device, due to infiltration of the packaging with chemicals that the device might be exposed in imaging in high/low pH and reactive liquids. Furthermore, in some cases, placing several chips together side-by-side, may be used to increase the imaging field. In these situations when the object to be imaged is larger than the area of one chip, the presence of surrounding space required for wiring on top surface may in certain cases limit the spatial density of chips and imaging. The fourth embodiment to be presented later in this disclosure allows imaging on the backside, while still offering many of the benefits cited for the first embodiment.

The ultrasonic transducers can be operated both in pulse-echo and electrical impedance measurement mode as described next:

In pulse-echo mode, the transducers are excited with a pulse, burst signal, or a wavelet. The wave travels through the silicon substrate, reflects back off the free substrate-air interface and travels back to the originating or neighboring AlN transducers. The amplitude and phase of the reflected pulse constitute the signal and is received after the ultrasonic pulse travels twice the substrate thickness. In the case of a sample present, the acoustic impedance of the sample will modulate the amplitude/phase of the originating pulse, and hence also the received signal. Therefore, the received signal amplitude/phase constitute the imaging signal just like it is in backside imaging approaches mentioned earlier [Kuo21, Abdelmejeed19, Hoople14]. Phased drive approaches are also possible [Hoople14] to improve SNR as done routinely in ultrasonic imaging.

In the impedance mode, the magnitude/phase of the input current of the AlN transducer is measured with forced AC voltage close to the resonance frequency of the stack or, likewise, by measuring voltage across the transducer with a forced AC current drive. Ratio of voltage to current in phasor form than gives the impedance of the AlN, which will be a function of the sample acoustic impedance since the sample constitutes a termination/boundary condition. If measured in steady state, impedance measurements of this sort capture higher order modes of the bulk silicon thickness originating from resonance due to multiple reflections off the substrate boundaries. The mean value of these oscillations can be shown to correlate with pulse-echo results. The continuous wave interrogation can lead to undesired and/or spurious signals due to the addition of multiple reflections from the entirety of silicon chip imager.

Given the peaks and dips in impedance vs frequency characteristics, which are due to substrate reflections, impedance measurement approach has a higher susceptibility to resonance frequency variations due to temperature, array uniformity and other factors. As such, pulse-echo approaches are used more commonly and is also the method of choice for ultrasonic mode of operation in the multimodal imagers presented here.

Reflection Mode for Ultrasonic Microscopy

Ultrasonic imaging shown in FIG. 1, in pulse echo mode, rely on reflection from the bottom surface of the sample based on the acoustic impedance of the sample. Therefore, the first embodiment only supports Reflection Mode but not the Transmission Mode for ultrasonic imaging. The second embodiment, to be explained later, supports both reflection and transmission.

Capacitive/Electrical Impedance/Potential Sensing

Capacitive/electrical impedance sensors can be realized using electrodes in close proximity or in-contact with samples, hence they are easy to implement in the standard CMOS technologies. While both electrical impedance (magnitude and phase) of the sample or electrical potential of the sample [Tokuda06] with respect to another reference electrode can be measured, our implementations focus on impedance/capacitance sensing due to amenability to lock-in approaches and resulting higher SNRs. Many electrical sensing applications such as capacitive touch or fingerprint sensors use a dielectric between the samples and electrodes for passivation and protection from wear/tear. Sensing is usually done at frequencies lower than MHz due to bandwidth considerations and higher responsivity of biological samples at lower frequencies.

In the described embodiment, the electrodes are on the same metal as the top electrode of the AlN transducers, because it is the metal layer closest to the sample and will have the highest sensitivity. As each pixel has transducers for four different domains, squeezing all four, with their respective row-column switching and readout electronics, within the tight pixel area is challenging. This is done by using the top electrodes of the piezoelectric transducers also as the electrodes for capacitive sensing. One approach to implement this concept is to use dedicated analog multiplexers for different modalities at top and bottom electrodes and is described later.

Optical Sensing

The first embodiment depicted in FIG. 1, uses lens-less optical microscopy and has two options for light sources. One is the backlight unit (BLU)/VCSEL-IR Visible LED array on top of the sample and the photodetectors (PD). The second light source is a similar module under the sample and the PDs. For the top lighting option, the signal received by the PD is determined by the thickness and the optical absorption of the sample since the device is characterized in the transmission mode. For the bottom light source, both the incident light and the light reflected off the bottom surface of the sample contributes to the signal. If the sample is mostly transparent and the BLU is designed to be mostly reflective, there will be some component in PD signal that is indicative of transmission characteristics of the sample. Note that, there will be a considerable amount of background signal for the bottom illumination since all the light is directly incident on the PD's first, before it reaches to sample. Background subtraction should cancel out this mostly spatially uniform constant component but will also reduce the dynamic range.

Photodiodes (PD) in camera pixels are often envisioned as capturing the incident light, hence they are designed to absorb as much of the incident light as possible based on the wavelength of the light and solid-state characteristics of the junction such as energy band diagram, doping profiles, junction depths and quantum efficiency. For instance, standard silicon CMOS PD based imagers, with a bandgap energy of 1.12eV, do not work well as IR cameras especially in the far-IR region (3-100 μm), because silicon is mostly transparent to radiation in this band as the photon energy is significantly less than the bandgap energy. Instead, monolithic CMOS compatible IR cameras on silicon substrates rely on detecting the incident radiation from the temperature change it causes via special coatings and/or suspended structures as done in microbolometers or thermophile focal plane arrays [Akin17].

Figure 2:
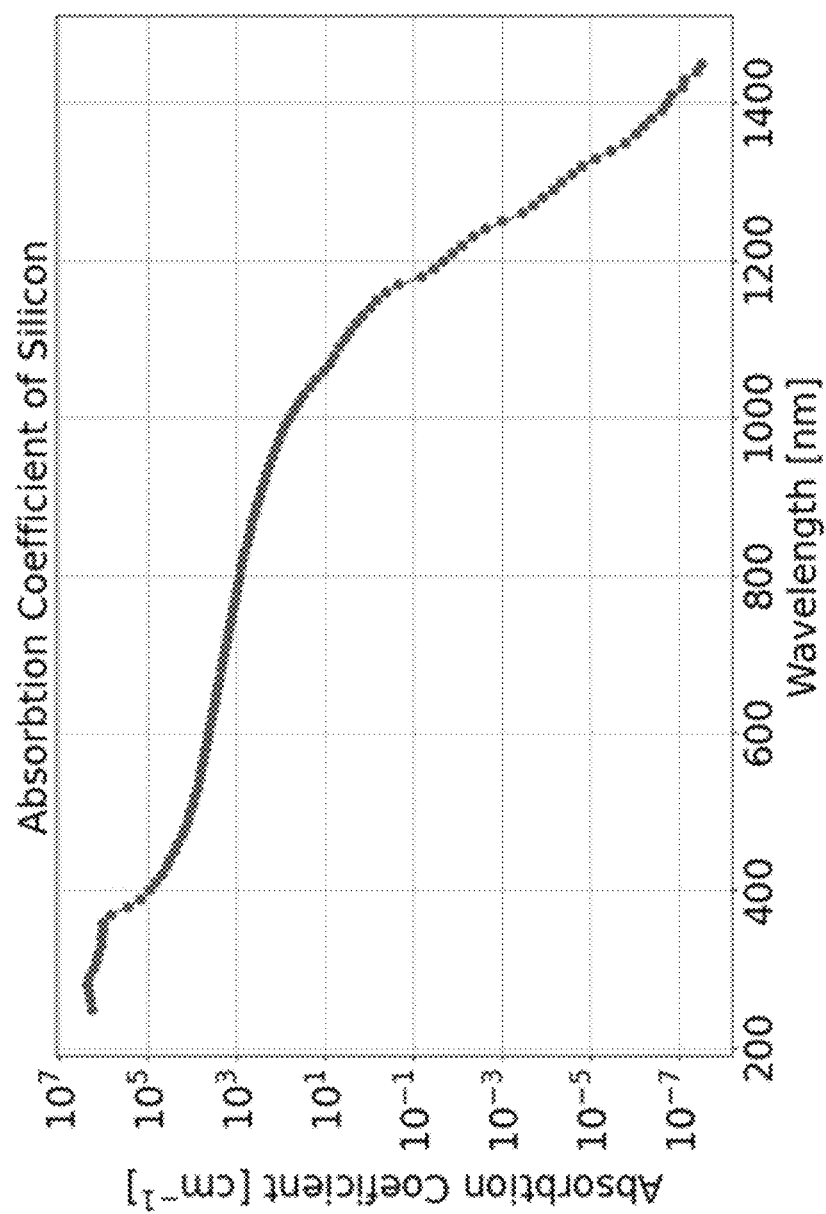
FIG. 2 is a graph representing the absorption coefficient of Silicon, in accordance with an embodiment.

The absorption coefficient of intrinsic silicon from Green et al. is given in FIG. 2 [Green08], which shows the tradeoff between PD sensitivity and the optical loss in the substrate silicon in the case of backside illumination of a 500 μm thick substrate.

Implementing CMOS on transparent substrates (E.g.: Silicon-on-Saphire (SOS)) is clearly a great solution to avoid the tradeoff mentioned above [Andreou01]. However, fabs offering this technology are not as common as those offering the traditional bulk or SOI CMOS technologies. Therefore, it needs to be shown that the device of the first embodiment is still feasible to implement with these bulk or SOI CMOS technologies. The following discussion addresses this need, using data and specs from the literature, and shows why near-IR wavelengths around (λ≈1050 nm) present a feasible solution for illumination from backside and light detection from CMOS-side as depicted in the first embodiment in FIG. 1.

TABLE 2

Photodiode Sensitivity From Backside at Various Illuminations: Sea-Level Solar and IR LED Illumination Cases

| Parameter | Value | | | Units | Reference/Notes |
|---|---|---|---|---|---|
| Wavelength | 1000 | 1050 | 1100 | nm | Design choice |
| Silicon Thickness | 500 | 500 | 500 | μm | Typical silicon thickness- if thicker substrate is used, it can be polished to this thickness |

TABLE 2-continued

Photodiode Sensitivity From Backside at Various Illuminations: Sea-Level Solar and IR LED Illumination Cases

| Parameter | Value | | | Units | Reference/Notes |
|---|---|---|---|---|---|
| Absorbtion Coefficient | 64 | 16.3 | 3.5 | $cm^{-1}$ | [Green95, PVWeb] |
| CMOS silicon photodiode sensitivity | 0.05 | 0.02 | 0.01 | A/W | See for example [Hamamatsu21] |
| Loss Factor in Silicon | 27.795 | 7.079 | 1.520 | dB | 20*log10(exp(Si Thickness * Absorption Coefficient)) |
| Loss Factor in Silicon | 0.041 | 0.443 | 0.839 | — | (exp(Si Thickness * Absorption Coefficient)) |
| Phtodiode Sensitivity From Backside illumination | 2.038 | 8.853 | 8.395 | mA/W | Photodiode Sensitivity resulting in case of backside illumination |
| Solar Radiation Direct + circumsolar $W*m^{-2}*nm^{-1}$ | 6.9159E-01 | 6.1802E-01 | 4.6113E-01 | $W*m^{-2}*nm^{-1}$ | [NREL_ASTMG173] |
| PhotoDiode Area Per Pixel | 100.000 | 100.000 | 100.000 | $(\mu m)^2$ | 4% of the cell size for a typical cell of 50 μm × 50 μm |
| PD Response to Solar Radiation From Back Side | 140.954 | 547.120 | 387.099 | fA/nm | PD Response to solar radiation (sea level) from back side per nm of wavelength |
| IR LED Illumination Output Power (1 mm distance from LED, backside) | 5.000 | 5.000 | 5.000 | mW | [IRLED_5010] Rated power is 7 mW |
| IR LED Spectral Bandwidth | 100.000 | 100.000 | 100.000 | nm | [IRLED_5010] |
| IR LED Viewing Half Angle | 45.000 | 45.000 | 45.000 | Degrees | Half Viewing Angle From LED Assuming it is a point source is ±45 Degrees [IRLED_5010] |
| LED to CMOS PD Vertical Distance | 1.000 | 1.000 | 1.000 | mm | 0.5 mm is the silicon thickness and 0.5 mm is reserved for spacing between the LED and the backside silicon surface |
| IR LED Illumination Power Density on CMOS PD (Excluding silicon Loss) | 1.250 | 1.250 | 1.250 | $mW/mm^2$ | Based on viewing angle and assuming 5 mW of the rated 7 mW diode power at 1 mm away from the CMOS PD [IRLED_5010], To cover the chip area of 10 mm × 10 mm one would need 5 LED's under similar operating conditions, I.e. 50 mW total Output |
| PD Response to IR LED Radiation From Back Side | 2.548 | 11.066 | 10.493 | pA/nm | PD output current Per unit spectral line width |

Table 2 summarizes the main parameters involved in the calculation of the CMOS PD response for both the case of sea-level solar radiation [NREL_ASTMG173] and using an IR LED [IRLED_5010] when illuminated from the back of the substrate. The calculation is carried out in three wavelengths for the 100 nm spectral range centered around $\lambda=1050$ nm by using silicon absorption coefficients from FIG. 2 and CMOS PD absolute spectral sensitivities from commercially available sensor arrays [Hamamatsu21]. Even though loss in silicon can vary from 28 dB to 1.52 dB in the range from 1000 nm≤λ≤1100 nm, photodiode sensitivity to backside illumination varies only by about 4 times, from 2 to 8.4 mA/W. This sensitivity yields, at 1050 nm, to PD current response of 547 fA/nm and 11.1 pA/nm (per unit wavelength of spectral bandwidth) in case of sea-level solar radiation and 5 mW IR LED illumination, respectively, when illuminated from back side. Note that a 5 mW IR LED gives almost 20 times the natural solar light at this wavelength.

One can take the above calculation a step further to calculate the SNR using the state of the art CMOS TIA input referred noise for a 60 frame per second imager. Table 3 lists the parameters used in this calculation. It can be seen that by using advanced low noise TIA architectures [Salvia09], one can reach, theoretical signal to noise ratios in excess of 35 dB and 60 dB using solar light and IR-LED's, respectively.

It should be emphasized that the concern for optical sensitivity and the calculations presented above are only valid for the case of backside illumination in the case of opaque or high-absorption substrates like silicon. In the case of transparent substrates or sapphire, the design is much simpler since UV, visible, and IR spectrum will have favorable passbands as allowed by the substrate's transmission characteristic.

TABLE 3

SNR calculation based on the solar radiation and IR LED illumination from backside

| Parameter | Value | Unit | Reference/Note |
|---|---|---|---|
| Average PD Response per Unit Wavelength to Power From Solar Radiation | 358.391 | fA/nm | See Table 2 |

TABLE 3-continued

SNR calculation based on the solar radiation and IR LED illumination from backside

| Parameter | Value | Unit | Reference/Note |
|---|---|---|---|
| (1000 nm < λ < 1100 nm) Average PD Response per Unit Wavelength to IR LED Radiation | 8.036 | pA/nm | See Table 2 |
| (1000 nm < λ < 1100 nm) Spectral Bandwith | 100 | nm | Sensitivity and input power assumed uniform |
| Frame Rate | 60 | Hz | Design choice |
| CMOS TIA Input Referred Current Noise Spectral Density | 65 | fA/ sqrt(Hz) | [Salvia09] Area of the TIA used here is 280 μm × 180 μm @ 180 nm CMOS. It may be necessary to share TIA's among multiple cells that might reduce the final frame rate. |
| CMOS TIA Input Referred Current Noise, Integrated | 503.488 | fA | |
| SNR in case of Solar Radiance | 37.047 | dB | See Table 2 |
| SNR in case of 1050 nm IR LED Illumination | 64.061 | dB | See Table 2 |

Transmission vs Reflectance Mode for Optical Imaging

Optical imaging for the first embodiment, unlike ultrasonic imaging, supports both transmission and reflection as mentioned before. When the sample is illuminated from the top, the sample is imaged in transmission mode, and when the sample is illuminated from bottom the sample is imaged mostly in reflection mode, but based on the transparency of the sample and the reflection characteristic of the backlight module on top, there can also be a transmission component. It is also possible to turn on both light sources, which then should result in a superposition of both of these modes.

The layout of the PD detectors require attention as they should be able to accept light from both top and bottom of the substrate. Therefore, one should eliminate metal routing under the PDs to avoid reflections in the case of backside illumination. Ray tracing simulations can aid to estimate the response of the PD based on optical parameters of materials, topography of samples, the gap between the sample and imager surface, and PD response characteristics.

Thermal Transduction

CMOS enables nW-to-μW temperature sensors with different tradeoffs in the power-vs-resolution space [Jeong14]. Note that silicon is a good thermal conductor, therefore, without suspended structures [Akin17] or custom SOI wafers, its performance is limited. In other words, thermal imaging sensitivity of the proposed embodiment will be limited by the thermal conductance of the substrate unless more complicated approaches are pursued in the fabrication of the CMOS die. As described in Section-2, glass substrates, with typically two orders of magnitude lower thermal conductivity than silicon, present a great option to improve thermal response. Thermal actuation is possible by resistor elements at the pixel level.

For the embodiments in this disclosure, we have chosen ultrasonic, capacitive, & optical as the high-priority imaging modes and thermal imaging as the secondary. In addition, we opted for silicon substrate to support easy and inexpensive manufacturability despite the large absorption and difficulties in optical sensing as explained in the previous section. Thermal isolation is yet another functionality silicon substrates are not good for. This can be acceptable if the thermal imaging is considered to be a lower-priority modality as in our case. Otherwise, one should investigate less-common post CMOS implementations to release structures or use different substrate materials. None of these advanced fab approaches or less common substrates are detailed with respect to our embodiment of FIG. 1, for which cost and ease of manufacturability are prioritized. Different applications and constraints can still be supported with the described embodiment by using specialized fab methods or pursuing different CMOS technologies as it may be apparent to those who are experts in the subject matter.

The Second Embodiment

Figure 3:
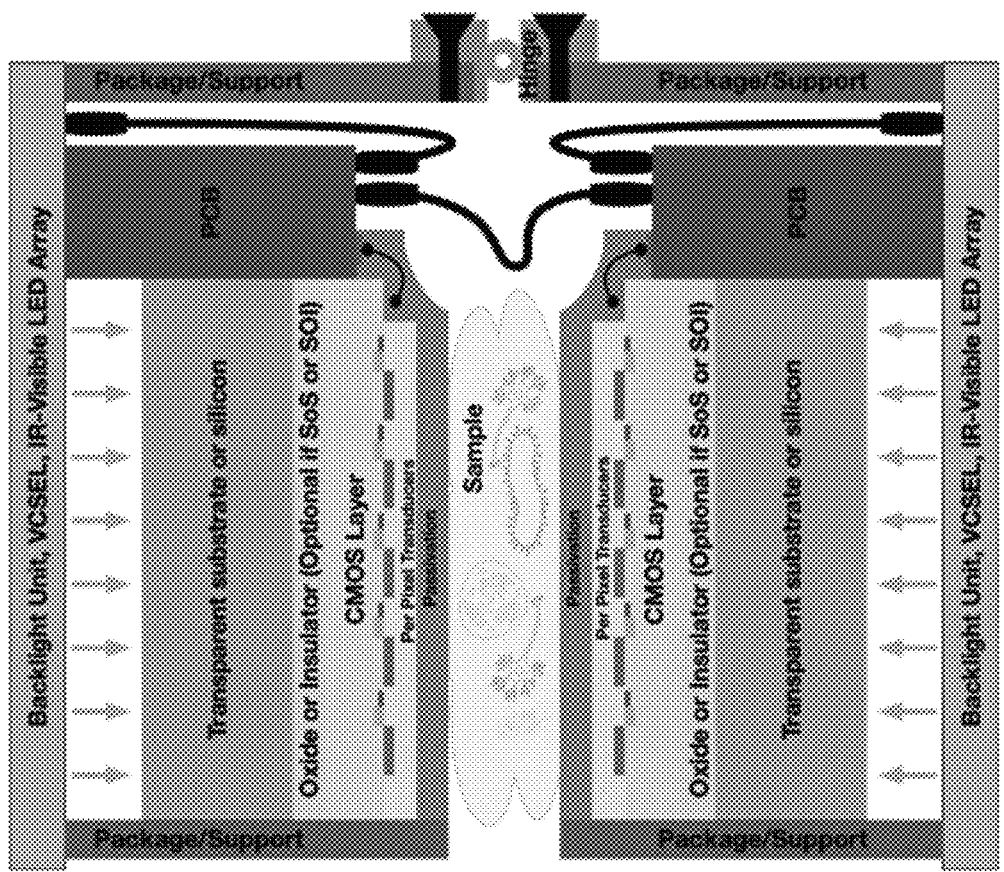
FIG. 3 is a schematic depiction of the main parts of an acoustic-optical-capacitive/electrical-thermal multi-mode imager, in accordance with an embodiment.

Given the multi-modal functionality introduced by the first embodiment, there might be cases where useful information can be obtained by imaging both sides of the sample. This is especially true for high frequency ultrasound where penetration depth in water may be limited to only a few tens of microns due to the large acoustic loss. FIG. 3 shows the second embodiment that addresses these needs. It is formed by stacking two of the first embodiment-type imagers so that their scanning sides face each other. Note also the functionality to load a sample in between the imagers, which can be done by hinges or loaded spring actuators that allows adjustable contact forces. While these are only two ways of attaching the top and bottom imager modules, one can come up with other methods without changing the scope of the invention.

Given that each imager has $N_{mode}=4$ modalities, the combined imager of the second embodiment will have the option for $(2N_{mode})^2=64$ operation modes involving TX and RX configuration for each of the four modality on top and bottom. While some of these modes may not be too useful, the ultrasonic mode in particular expands the capability of the first embodiment significantly. For instance, for soft biological samples, by controlling the thickness of the sample with an external adjustable z-force (orthogonal to the FPA surface) from the hinge/spring structure, transmission mode imaging of the sample is also possible. Remember that this mode of imaging is not enabled by the first embodiment. Another example application can be the characterization of thermal properties of the sample by heating the sample locally using per-pixel resistor elements, or by the light sources on top and bottom (if the substrate is transparent). This can yield relative information about the thermal conductivity and resistance of the sample locally after the response due to thermal diffusion the substrate is subtracted.

An important advantage of the second embodiment comes with the ability to enhance the capacitive imaging capabilities. First embodiment relied on measuring inter-electrode capacitance among lateral structures, that would mean that the electric fields involved in capacitance contrast images are mostly parallel to the imager surface. On the other hand, second embodiment allows interrogation of parallel plate capacitances (with the sample as the dielectric) via electrical fields perpendicular to the imager surface. Therefore, the second embodiment paves the way to investigate anisotropic dielectric properties of samples. This is in addition to the time-of-flight and sample speed of sound measurement capability introduced by the transmission mode ultrasonic imaging, thanks again to the dual imager arrangement of the second embodiment The second embodiment also helps with the calibration of the imager. By operating the imager with only water as the sample, one can calibrate the incident light by driving one light source and measuring with photodetectors (PD's) on either side. As the optical transmission of water is well known across a wide range of frequencies, the optical loss due to the sample can be measured with a reasonable accuracy. For the acoustic mode, ultrasonic radiation intensity emitted by one side of the imager can be picked up by the ultrasonic transducers on the other side to calibrate the 1-D models with improved accuracy.

The Third Embodiment

One can argue that having the delicate CMOS circuits and wire-bonds on the imaging side increases wear and tear on the passivation or enhances the risk of ESD failures if the SoC is not properly micro-packaged. There is also the argument about the wire bonds causing protrusion around the imaging chip due to finite loop height.

Figure 4:
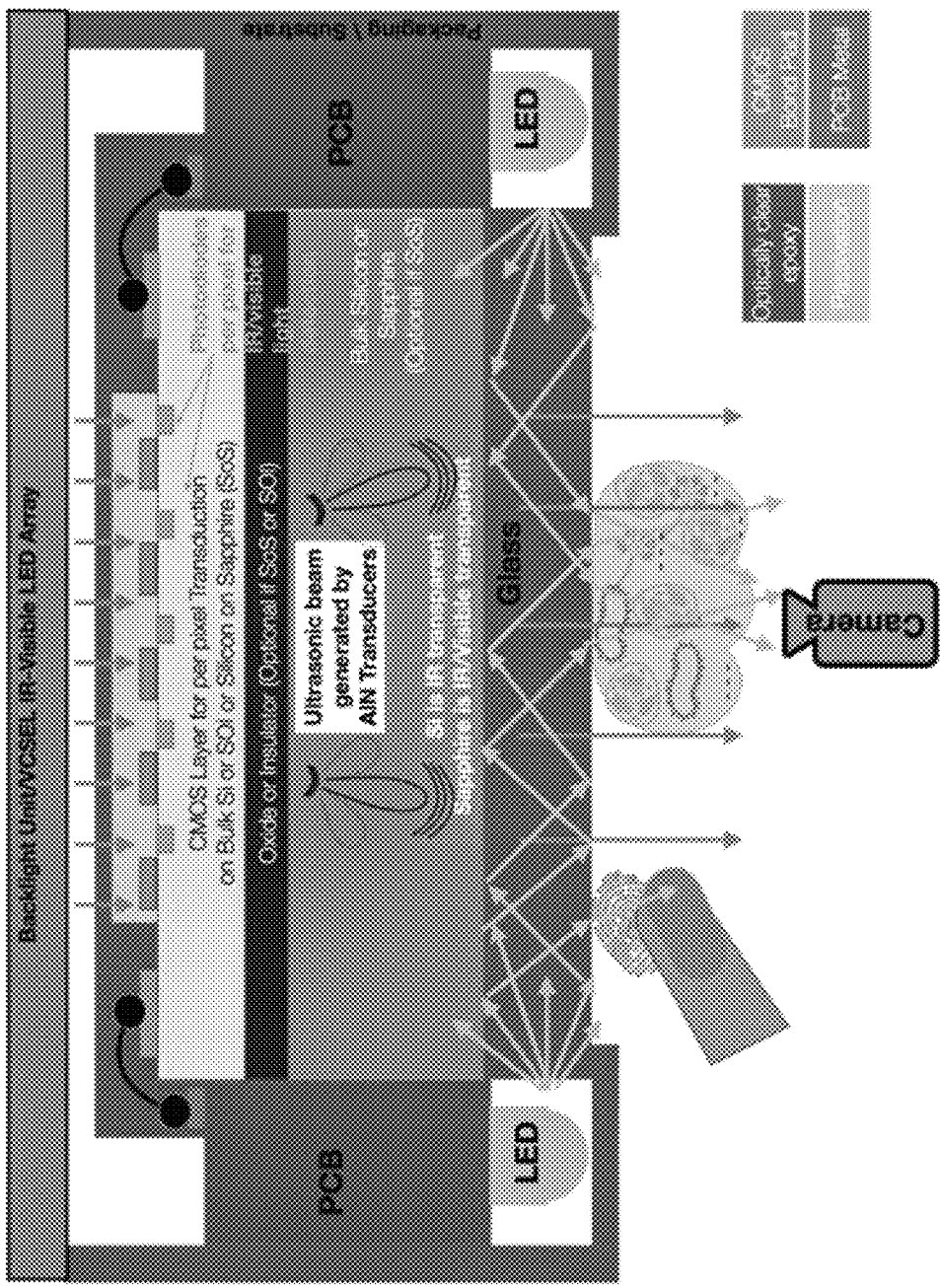
FIG. 4 is a schematic depiction of the main parts of an acoustic-optical-capacitive/electrical-thermal multi-mode imager, in accordance with an embodiment.

While all the above issues have solutions as proven by millions of capacitive touch sensors in the market today, SoC packaging costs can potentially be lower if the acoustic imaging is done on the backside. To that end, a simpler imager system that images the sample on the back of the CMOS substrate, the third embodiment, is shown in FIG. 4. This system allows optical and acoustic imaging, but discards the thermal sensing and capacitive sensing, as they are not sensitive when the sample and sensing surface (i.e. CMOS layers) are not on the same side. This will also simplify the overall design and allow more room in the pixel for other modalities. Note that the ultrasonic imaging method used by the third embodiment of FIG. 4 is similar to what Geegah produces as of 2021.

There are two light sources in FIG. 4. The first light source is the backlight unit/or VCSEL Array/or LED (Visible/IR) array. The light from this source passes through the photodetectors (PD) on the CMOS layer, goes through the substrate and reaches target sample. Based on the optical properties of the target, substrate (Si or SoS or SOI) transmission characteristics, the wavelength of light (Visible/IR), part of the incoming flux can either be detected through the camera at the bottom of FIG. 4 or the PD detectors on the CMOS layer. There can be various scenarios of high and low SNR optical detection cases, both for the camera itself and the PDs implemented on the CMOS side, based on the parameters mentioned. Most of these cases will be clear to those who are experts in optical sensor design and will not be described further in this disclosure.

The second light source on the bottom of the PCBs consists of LED's coupling its light mostly to the glass layer bonded on the back side of the imager, between the substrate and sample. This additional glass layer functions as a light-waveguide that carries the light through total internal reflection. When there is a sample that has significantly higher index of refraction than air, such as water, finger, or other biological samples, the light will diffract out of the glass and illuminate the sample. External camera facing the sample will be able to gather images using this light. Note that the side LED can be in the visible or IR spectrum since this modality of imaging only requires glass and air as the transmission medium. However, if a transparent substrate is used and/or IR light is used with a silicon substrate, i.e. if the substate is transparent for the band of light used, PD detectors on the CMOS side will also be able to pick up images from the sample, and bonding of the glass layer may not be necessary.

Acoustic modality of the third embodiment works in pulse-echo mode in a similar fashion to current Geegah imager [Kuo21, Baskota22]. However, as described in Section 2.1.A, it is also possible to operate in the impedance mode with associated shortcomings.

The Fourth Embodiment

The acoustic pulses that reach to the sample (medium or object) can not only be used to image the surface of the sample and imager boundary through reflections but can also be used to bulk properties of the sample in transmission mode through pulses that penetrate the sampled tissue or liquid. This is sometimes desired, for example to measure the speed of sound in the liquid or solid. As a specific example, as one goes deeper into the ocean, the speed of sound changes due to the variation in pressure, temperature, and salinity. In the case of liquids, sometimes the addition of the sample can lead to creation of biochemical events such as corrosion, or bio-film formation. There is therefore a need to monitor the surface formation of any thin layer while at the same time measuring the time of flight in the sample. Any thin layer thickness measurement and its two-dimensional growth history can be used to determine the thin film formation. Furthermore, parts of the imager itself, such as the back-light unit and/or LED light sources can be used as reflectors to perform time-of-flight (TOF) measurements.

Figure 5:
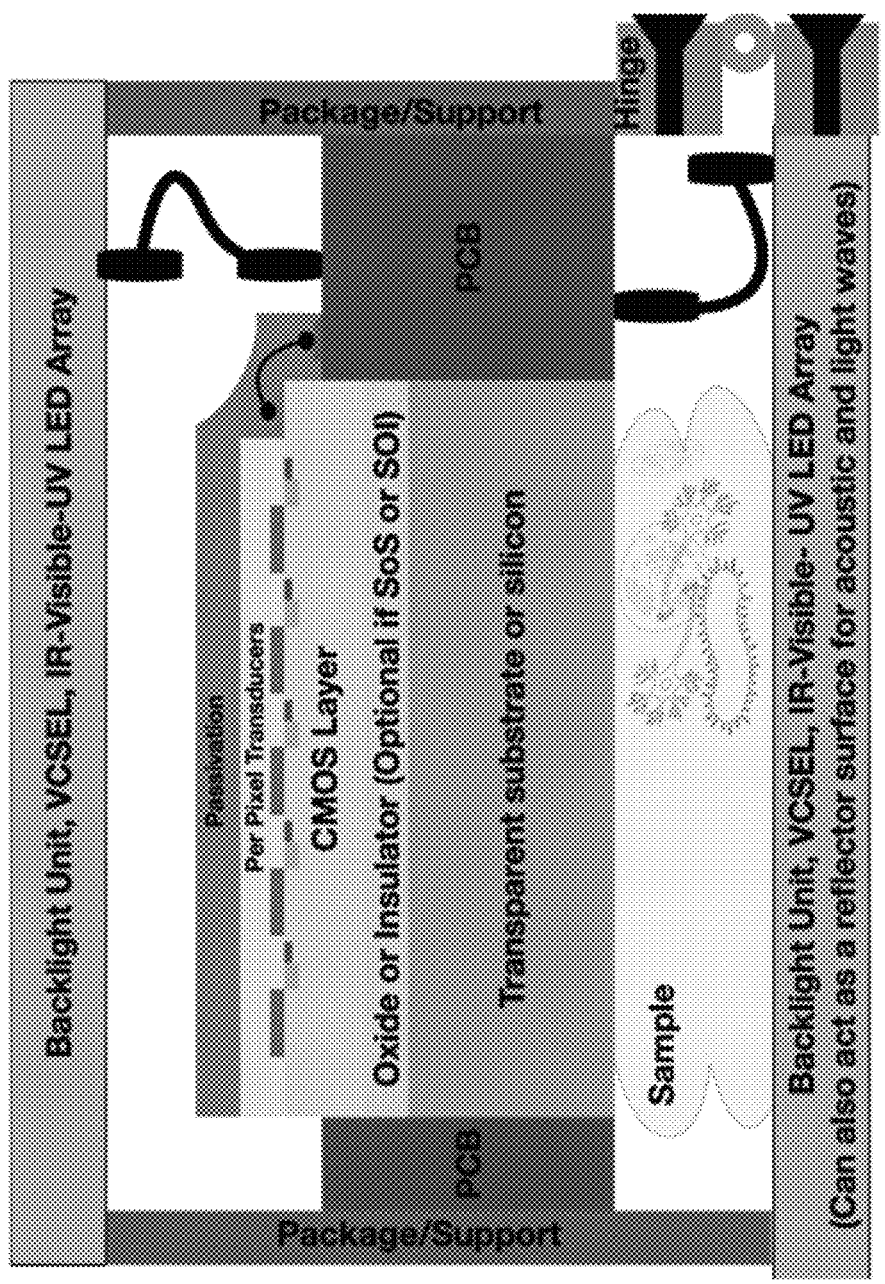
FIG. 5 is a schematic depiction of the main parts of an acoustic-optical-capacitive/electrical-thermal multi-mode imager, in accordance with an embodiment.

FIG. 5 shows an illustration for a preferred way to realize the fourth embodiment that can be used for the application described above in addition to other applications. Here, there are two light sources placed above and below the CMOS side of the imager that has the transducer elements per pixel or per plurality of pixels. These light sources can be excited simultaneously or independently to acquire optical images of the sample and the medium in reflection and/or transmission mode. AlN ultrasonic transducers on the CMOS side can operate both in pulse-echo and impedance mode as explained in Section 2.1.A. In the preferred pulse-echo mode, the acoustic pulses transmitted from CMOS side into the substrate either reflect or get transmitted once they reach to the sample or target medium. Reflected pulses reach back to the AlN transducers on the CMOS side to form acoustic images in reflection mode. The transmitted samples travel through the sample and can reflect from the other side of the sample surface if there is an air gap, or they can reflect from the bottom light source to eventually travel back to the AlN transducers if the acoustic absorption is low enough for the thickness of the imaged sample. These pulses that travel through the sample can be used for acoustic imaging in transmission mode. As they arrive a certain time delay after the first set of (reflected) acoustic pulses and this delay duration is determined by Time-of-Flight through the sample, the arrival times of pulses can be used to calculate the speed of sound in the sample or target medium. Furthermore, their amplitude carries information about the acoustic loss, discontinuities, or scattering sources in the sample or throughout the medium. This data is available for every pixel and can be recorded as a 2D image. In addition, transmitting and receiving transducers and phases of their excitation and reception can be different from neighboring pixels, which enables different flavors of multi-modal imaging and phased-imaging.

In addition to the above functionalities, there may be cases where the light source can serve to modify or treat the sample or target medium. For example, in the case of speed of sound measurement in ocean, it may be necessary to limit or stop the formation of the biofilm on the imager surfaces, potentially using light exposure from the UV LEDs on both sides of the imager. Hence, the UV light sources on top or below the multi-modal imaging chip can be used to provide UV radiation to prevent formation of or remove the cells that might adhere to the imager or imaged surfaces. This UV light can act as an anti-fouling agent to keep the surfaces clean over time. This removal of the thin film controlled by activation of the UV-light source can be used to monitor the presence of biofilm forming bacteria and fungi in the liquid that is being imaged. As explained above, the surface of the same UV light source can be used also as the acoustic reflector for acoustic imaging in the transmission mode and ToF measurements.

As in earlier embodiments, multiple transducers per pixel or per plurality of pixels can be used for cross-domain imaging such as photoacoustic or acousto-optic imaging. Thermal or electrical/capacitive transducers on the CMOS die may have inferior sensitivity due to distance to the sample or thermal leakage in the substrate. Alternative solutions involve implementing certain type of transducers on the backside of the CMOS die and using through-silicon via (TSV) interconnects. Note however that this approach limits the density of transducer and increase complexity and cost significantly. A separate hybrid integration of a layer of electrodes can be bonded on the backside of the silicon die as well for electrical/capacitive imaging. The density of interconnects either through the silicon die itself or PCB vias and wire bonds may be limiting factors for these approaches. For these reasons, cost per imaging unit area of sample can be significantly higher making these alternative solutions less attractive.

OTHER FEATURES

Transparent Substrate Option

All the embodiments described in this disclosure are designed to work with the ubiquitous CMOS substrate, silicon, by a careful choice of the center wavelength, around $\lambda=1050$ nm. As highlighted multiple times, optical imaging modes described in this disclosure can benefit immensely from transparent substrates since they allow operation in the visible range and a much wider selection of light sources to be used as backlight modules, LED's or VCSEL. Those who are experts in the field can come up with other spectral ranges if substrates other than silicon is used without changing the scope of this disclosure. Likewise, more sensitive electronics can also enable higher SNR at a given wavelength, hence extending the range of operational electromagnetic spectrum.

Electrode sharing for Ultrasonic and Capacitive Transduction

Figure 6:
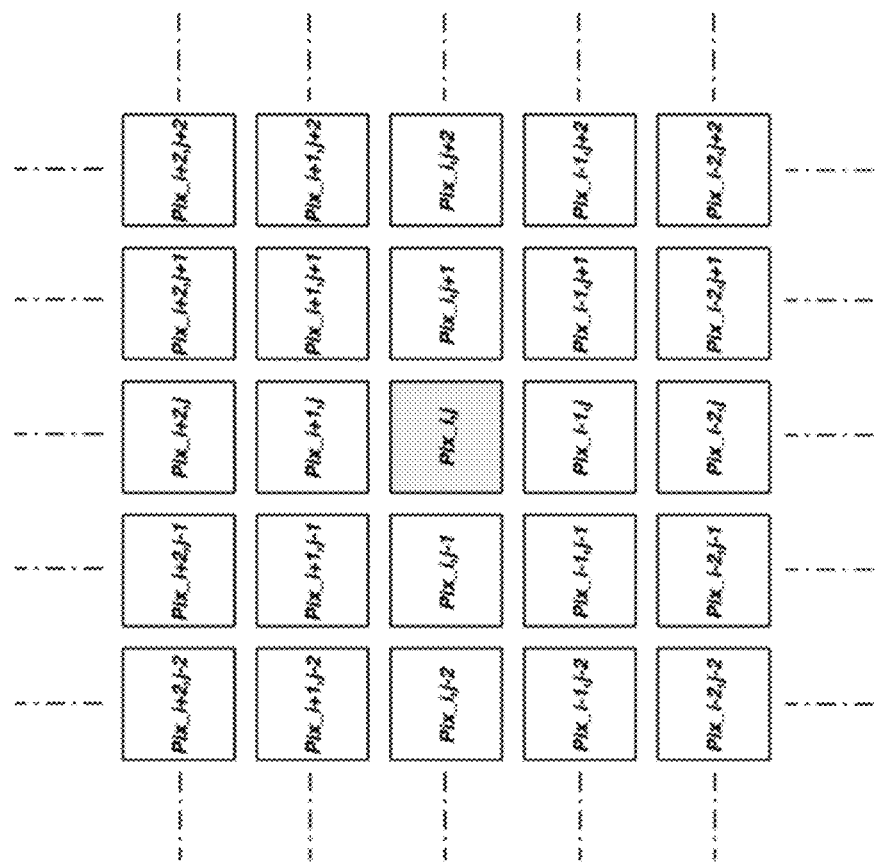
FIG. 6 is a schematic of a focal plane array of imagers and their numbering conventions, in accordance with an embodiment.

Trying to pack more and more transducers into the unit-pixel of a focal plane array (FPA), with their own switching/drive/readout electronics is one of the most challenging parts of the design of a multi-modal imager. A sample subarray of such an array is shown in FIG. 6. In the coming section, one of the pixels in this FPA, Pix_i,j is considered and the consequences of packing more than one modality within the same pixel area are investigated.

For a radial ultrasonic transducer of radius a, the full-width-half-maximum (FWHM) is given as:

$$FWHM = 1.4 \frac{z\lambda}{2a},$$

where $\lambda_\alpha$ is the acoustic wavelength and z is the orthogonal distance between the point of measurement and the origin assuming x-y plane is coplanar with the transducer [Cobbold]. This equation shows that the directionality of emitted ultrasonic beam increases for larger aperture transducers. For a wafer of thickness 500 µm, and assuming a pixel size of 50 µm (with all the pixel consumed by a circular transducer) at f=1 GHz, and taking the silicon longitudinal phase velocity of $c_{p,Si}$=8430 m/s, we have $\lambda_{Si}$=8.43 µm. Then the width of the first echo (propagation length of z=2×thickness=1 mm) is calculated as FWHM=118 µm, which is already more than twice the aperture size. This is a result of diffraction and leads to cross-talk among neighboring pixels during imaging. Therefore, a good design of the pixel will try maximize the fill factor for the ultrasonic transducer, hence using most of the pixel area for the ultrasonic transducer. On the optics side, PD area of 10 µm×10 µm in Table 2, yielded a reasonable SNR even with solar radiation from backside. This would correspond to 4% of the pixel area at 50 µm pitch. For capacitance sensing, let us assume one uses all of the area as an electrode. Then the parallel plate capacitance between the CMOS electrode and a sample that is 50 µm away (space for packaging+CMOS passivation+potential gaps between sample and the passivation) leads to a capacitance on the order of 1.7 fF with an effective dielectric constant similar to that of oxide, 3.8. Detecting small changes in already such a small capacitance for imaging purposes is exigent as apparent from close to 0.3 aF resolution of some off-the shelf capacitance to digital converters.

The discussion above shows that high density FPA's with pixel sizes on the order of 50 µm already push the limits for what can fit in a given pixel area for either ultrasonic or capacitive transduction, let alone fitting both within the same pixel. To ease with this tradeoff, we propose using the electrodes of piezoelectric transducers also for capacitive transduction, namely TX and RX channels for capacitive sensing.

Figure 7:
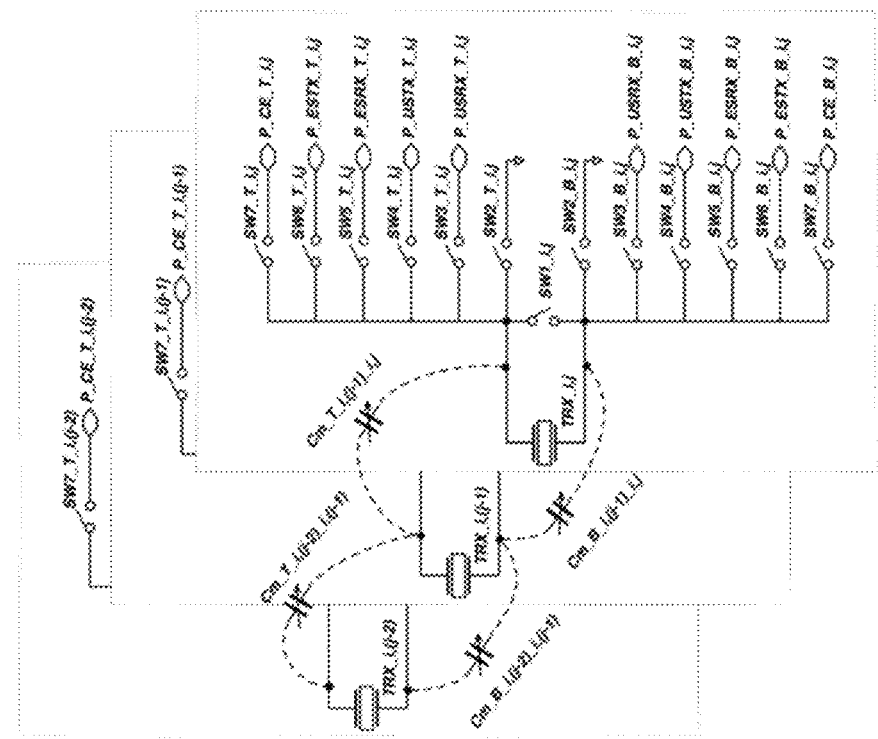
FIG. 7 is a schematic of a reconfigurable pixel drive and sensing architecture for ultrasonic and electrostatic modalities with separate switches for top and bottom electrode, in accordance with an embodiment.

The basic architecture for the electrical connections to use the same electrodes of the piezoelectric device also for capacitive sensing is shown in FIG. 7. Here, each piezoelectric transducer's top and bottom electrode can be multiplexed to serve as: (i) ultrasonic transmitter or receiver, (ii) electrostatic transmitter or receiver, (iii) GND electrode, or to connect to (iv) custom electronics or to be (v) shorted to each other and act like a single electrode without providing any piezoelectric transduction.

Multiplexing can be done via low-resistance complementary transmission gates or other well-known methods in the art. Note that there is a switch that shorts the top and bottom electrodes to make sure piezoelectric device is not excited in case its electrodes are being used with electrostatic TX or RX functionality. The control signals used to generate the modality of each pixel (i.e. the gating signals for multiplexing switches) can be global signals along rows and columns of the focal-plane-array (FPA) shown in FIG. 6. It should be noted that each global row/column signal extending end-to-end across the array also consumes valuable metal routing space over the unit pixel area. Another approach is to have pixel-level registers for each control signal and write them at the beginning of the imaging scan. Note that the latter approach has significant benefits as it allows full configuration of TX and RX patterns on the FPA as described in the Section 3.3, although it complicates the row and column control electronics.

For cross-domain imaging, such-as acoustic imaging & capacitive pickup, or electrostatic excitation & acoustic pickup, it may be necessary to have RX pixels sense at the same time the TX pixels are transmitting. For these cases, once can conceive situations in which one pixel transmits acoustically while the neighboring pixels sense in capacitive mode for multi-modal imaging.

Note that during purely acoustic imaging, there is a time delay between the excitation of the pulse during TX and receiving after reflection from the back of the silicon. This is the standard time-of-flight (ToF) delay determined approximately by the thickness of the substrate and the speed of sound in the substrate. It is therefore possible to use the same pixel for both TX and RX by connecting the top and bottom electrodes to proper TX and RX electronics, respectively, using the switches in FIG. 7 [Kuo21, Baskota22]. One may not have this convenience of time delay during cross-domain imaging. Consider for example acoustic-to-capacitive imaging modality. When the acoustic TX is sent, since the sample is in close proximity to the ultrasonic transducer for the Embodiment-1 and Embodiment-2 type imagers, any change in the charge coupling between the sample and the electrostatic will be within nanoseconds making it impractical to time switching precisely. This is where the flexibility offered by the architecture of FIG. 6 becomes critical as detailed in Section 3.3. It should also be emphasized that by proper coordination of the electrode switches, both mutual and self-capacitance readout can be realized among neighboring top and bottom electrodes of the piezoelectric transducer.

Another feature offered by FIG. 7 is the symmetry with respect to bottom and top electrodes. If so desired, one can ground either the top or bottom electrode, allowing one to provide a quiet low-voltage electrical potential to samples that might be sensitive to electrical noise or other electrochemical interference. Likewise, grounding the top electrode during piezoelectric drive can act like an electromagnetic shield and improve the immunity to external cross-talk.

Some of the US and ES TX and RX circuits that can be used with the above architecture are exemplified in FIG. 8. These include transimpedance amplifiers with resistive and capacitive feedback for ES and US readout, pulser circuits or arbitrary waveform generators that can be used for self and mutual capacitive sensing. These circuits can support both self and mutual capacitance measurements. The former type in particular is critical for non-contact (hover) modes.

In FIG. 8, "CE" is used to represent "Custom Electronics," and it can be used to implement other functionalities such as merging of TX or RX pixels to be driven/read by a single circuitry while increasing the effective pixel size or making sure the drive phase is synchronized across multiple pixels by shorting their electrodes. Other circuits that are well known by those experienced in the art of transducer design, such as demodulators, envelope detectors, wavelet shaping, filters, ADC's, phase shifters for phased drive can be amended to the above circuits. For instance, one can replace the US-TX pulse generators with burst of sine waves with different phase shifts across neighboring pixels to realize phased drives. These and other functionalities that are enabled by the flexible architecture of FIG. 7 can be used without changing the scope of the disclosure.

TX-RX Configurability: SNR, Frame Rate Optimization, Multi-modal Scan Configurations, and Circuit Sharing among Pixels Many current capacitive touch sensors that use mutual and/or self-capacitance detection rely on a fixed configuration of TX & RX electrodes. As many capacitive touch sensors are designed to interact with finger and are used to work over large areas such as laptop or cell-phone screens, the pixel size is in the mm-scale and do not need to change during the lifetime of the device. As for the channel count of TX and RX electrodes, many of the standard off-the-shelf touch controllers allow for a few dozens of TX, RX channels. For example, one of the high-node count (product of number of channels for TX and RX) advanced touch controllers support 32 TX and 52 RX lines [Microchip1665XT]. On the other hand, for a general purpose imager described in this disclosure with potentially more than 100 pixel on each side ($>10^4$ channels TX/RX channels), it might be necessary to experiment with different TX/RX configurations to improve SNR or to change the effective scan area and location to increase frame rate.

FIG. 9 illustrates some examples of different pixel configuration for the case of US and ES modalities. FIG. 9a shows a checker board map of ES TX and RX functionality for imaging mutual impedance/capacitance gradients. FIG. 9b shows standard capacitance imaging in self-cap mode. FIG. 9c extends the case in FIG. 9a to larger pixel size, which can be useful for resolution vs power tradeoff. Furthermore, this might allow circuit sharing among different pixels provided that the additional electrical loading is taken into account. On the RX side, pixel sharing can also help with SNR if the increase in the sensor area is larger than the increase in the parasitics. FIG. 9d shows mutual cap sensing using a design similar to the common bar-and-stripe design but with ground strips dispersed among pixels to improve the SNR for poorly grounded samples. FIG. 9e shows the standard pulse/echo or impedance ultrasonic imaging where each pixel is time-multiplexed to dedicated TX and RX circuits [Kuo21]. FIG. 9f shows US mode with every-other pixel listening to RX emitted by their neighbors. FIG. 9g shows multi-mode imaging with half the pixels excited electrostatically and the other picking up US signatures in a checked board pattern. While this mode may not reveal a detectable signal in soft and biological samples, it can be invaluable for samples with electro strictive properties or for molecular dynamics studies. FIG. 9h functions in the inverse modality of FIG. 9g, with US as TX and ES as RX. It can be used for dielectrostrictive studies.

Figure 9C:
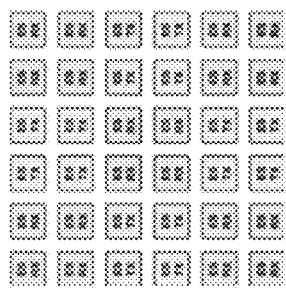
FIGS. 9A-9I are illustrations of different combinations of pixel modalities for the FPA in case of US, ES and US-ES cross domain imaging, in accordance with an embodiment.
Figure 9F:
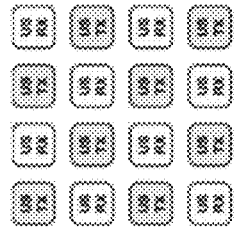
Figure 9I:
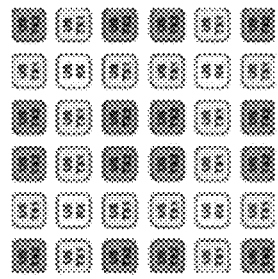
Figure 9B:
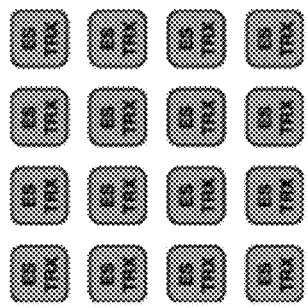
Figure 9E:
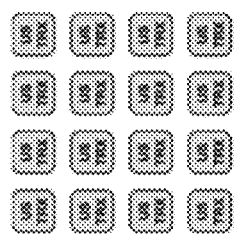
Figure 9H:
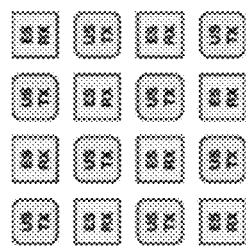
Figure 9A:
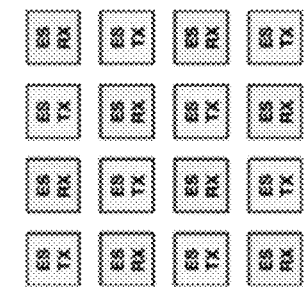
Figure 9D:
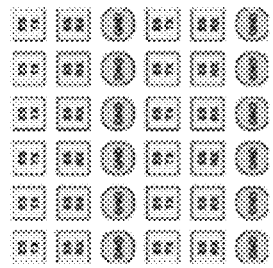
Figure 9G:
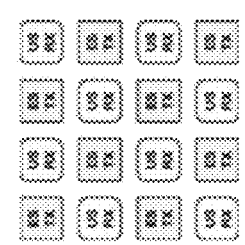

The final example in FIG. 9i shows the phased drive in US mode. Here there are two different US-TX pixels, US-TX1 and US-TX2, each driven with a different phase based on their distance to the US-RX pixel located centrally between the US-TX pixels. By proper selection of the phases, one can increase the signal at the RX pixel [Hoople14]. This concept of phased drive can be applied to other imaging modalities as well and is used commonly in ultrasonic imaging [Cobbold, Ch 7]

Scan Plans

Sequencing of the multi-modal imaging and synchronization among different TX and RX cycles for each mode is critical. Any CMOS implementation will either need an on-chip scan controller or need to work with another FPGA or micro-controller to manage the scan. While this disclosure will not detail specifics of scan-plans, any implementation needs to support both simultaneous and also sequenced TX-RX operation among different modalities while also controlling the per-pixel switches shown in FIG. 7. Note that, it can be possible to merge per-pixel switches to per-row or per-column switches across the FPA to simplify the control electronics and scan-plans, but with reduced flexibility.

Spectroscopy and Time-Resolved Imaging

Both US and ES methods are sinusoidal drive in nature and can be carried out for a range of excitation frequencies as supported by the bandwidth of the system. For the configurations shown in FIGS. 9e and 9f as an example, in US TX/RX mode, sweeping the frequency allows for finding the resonance peak that is determined by the imaged sample and the piezoelectric stack. Furthermore, if the switches in FIG. 7 are gated properly using customized scan plans and if switching speed requirements are met, one can use time-resolved imaging or stroboscopic techniques for more advanced imaging results.

Heterodyne Techniques and Filtering to Improve SNR

In addition to changing the excitation frequency, heterodyne techniques that modulate the drive amplitude of the TX excitation source and then down-convert using the carrier frequency to extract in-phase and out of phase component can be employed at TX/RX. As well known by those experienced in the field, this allows narrowband operation in the presence of background interferers or noise and improves the SNR. Similarly, one can also use various filters to reject out-of-band noise in different imaging modalities. It should also be emphasized that modulation of the RX or TX fields is inherent in many imaging modalities such as acousto-optic imaging, where "some of the light is modulated by an ultrasonic wave inside the biological tissue and carries the ultrasonic frequency." [Yao2000]

Some features of the described multi-imager embodiments are summarized below:
- A compact, single-chip solution with per-pixel transduction circuitry for multi-modal imaging that can be used for excitation and sensing across different domains as well as within single domain
- Cross-domain imaging: Excite in one-domain and image in the other
- Acoustic, electrical, optical, and thermal sensors per pixel for multi-domain imaging
- No need for registration among different modalities as compared to multiple chip solutions, where registration errors between different modalities, such as ultrasound and optical can be >1 mm and require additional calibration
- Share the same readout electronics such as ADC, mixed-signal processing, row-column decoders and multiplexer circuits across different modalities to save power and reduce the transistor count
- High value of innovation per mm² of CMOS: $N_{mode}^2$ microscopes in a single device for the case of the first imager
- Single chip solution and cost effective
- Using an FPA for ultrasound and other modalities eliminate motorized position control and slow mechanical scans used in some other implementations such as surface acoustic microscopes with a single transducer
- Visible or florescence microscopy possible without optical fibers
- Spectroscopy measurements for each of the modalities by changing the frequency of excitation and/or detection for TX and RX, respectively
- Flexible drive electronics allow sharing of transducer electrodes for different modalities allowing more compact pixel layouts While various embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, embodiments may be practiced otherwise than as specifically described and claimed. Embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

The above-described embodiments of the described subject matter can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single device or computer or distributed among multiple devices/computers.

6. References Incorporated by Reference

[Huang15] Huang, Xiwei, et al. "A dual-mode large-arrayed CMOS ISFET sensor for accurate and high-throughput pH sensing in biomedical diagnosis." *IEEE Transactions on Biomedical Engineering* 62.9 (2015): 2224-2233

[Huang14] XIWEI, HUANG. "CMOS MULTIMODAL SENSOR BASED LAB-ON-A-CHIP SYSTEM FOR PERSONALIZED BIO-IMAGING DIAGNOSIS," Ph.D. Thesis, 2014.

[Tokuda06] Tokuda, Takashi, et al. "A CMOS image sensor with optical and potential dual imaging function for on-chip bioscientific applications." *Sensors and Actuators A: Physical* 125.2 (2006): 273-280.

[Mela 21] Mela, Christopher, Francis Papay, and Yang Liu. "Novel multimodal, multiscale imaging system with augmented reality." Diagnostics 11.3 (2021): 441.

[Mezil20] Mezil, Sylvain, et al. "Single-shot hybrid photoacoustic-fluorescent microendoscopy through a multimode fiber with wavefront shaping." Biomedical Optics Express 11.10 (2020): 5717-5727.

[Yao2000] Yao, Gang, and Lihong V. Wang. "Theoretical and experimental studies of ultrasound-modulated optical tomography in biological tissue." Applied Optics 39.4 (2000): 659-664.

[Akin17] Tankut, Firat, et al. "An 80×80 microbolometer type thermal imaging sensor using the LWIR-band CMOS infrared (CIR) technology." Infrared Technology and Applications XLIII. Vol. 10177. International Society for Optics and Photonics, 2017

[Green08] Green, Martin A. "Self-consistent optical parameters of intrinsic silicon at 300 K including temperature coefficients." *Solar Energy Materials and Solar Cells* 92.11 (2008): 1305-1310.

[Kuo21] Kuo, Justin, et al. "Gigahertz Ultrasonic Imaging of Nematodes in Liquids, Soil, and Air." 2021 *IEEE International Ultrasonics Symposium (IUS)*. IEEE, 2021.

[Abdelmejeed19] Abdelmejeed, Mamdouh, et al. "Monolithic 180 nm CMOS Controlled GHz Ultrasonic Impedance Sensing and Imaging." 2019 IEEE International Electron Devices Meeting (IEDM). IEEE, 2019.

[Hoople14] J. Hoople, J. Kuo, S. Ardanuç and A. Lal, "Chip-scale reconfigurable phased-array sonic communication," 2014 *IEEE International Ultrasonics Symposium,* 2014, pp. 479-482, doi: 10.1109/ULTSYM.2014.0119.

[Baskota22] Baskota, Anuj, Justin Kuo, and Amit Lal. "Gigahertz Ultrasonic Multi-Imaging of Soil Temperature, Morphology, Moisture, and Nematodes." 2022 IEEE 35th International Conference on Micro ElectroMechanical Systems Conference (MEMS). IEEE, 2022.

[Cobbold06] Cobbold, Richard SC. Foundations of biomedical ultrasound. Oxford university press, 2006.

[Hamamatsu21] s15908-512q CMOS Linear Image Sensor Datasheet, Hamamatsu https://www.hamamatsu.com/content/dam/hamamatsu-photonics/site/documents/99_SALES_LIBRARY/ssd/s15908-512q_etc_kmpd1239e.pdf

[NREL_ASTMG173] 2000 ASTM Standard Extraterrestrial Spectrum Reference E-490-00, https://www/nrel.gov/grid/solar-resource/spectra-astm-e490.html

[IRLED_5010] MTE5010-995-IR Infrared Emitter Datasheet, Marktech Optoelectronics, https://marktechopto.com/pdf/products/datasheet/MTE5010-995-IR,.pdf

[Salvia09] Salvia, James, et al. "A 56MΩ CMOS TIA for MEMS applications." 2009 IEEE Custom Integrated Circuits Conference. IEEE, 2009.

[Andreou01] A. G. Andreou et al., "Silicon on sapphire CMOS for optoelectronic microsystems," in *IEEE Circuits and Systems Magazine*, vol. 1, no. 3, pp. 22-30, 2001, doi: 10.1109/7384.963464.

[Jeong14] S. Jeong, Z. Foo, Y. Lee, J. Sim, D. Blaauw and D. Sylvester, "A Fully-Integrated 71 nW CMOS Temperature Sensor for Low Power Wireless Sensor Nodes," in IEEE Journal of Solid-State Circuits, vol. 49, no. 8, pp. 1682-1693, Aug. 2014, doi: 10.1109/JSSC.2014.2325574.

[Laudereau15] Laudereau, Jean-Baptiste, et al. "Multimodal acousto-optic/ultrasound imaging of ex vivo liver tumors at 790 nm using a Sn2P2S6 wavefront adaptive holographic setup." Journal of biophotonics 8.5 (2015): 429-436.

[Beard11] Beard, Paul. "Biomedical photoacoustic imaging." *Interface focus* 1.4 (2011): 602-631.

[Steinberg19] Steinberg, Idan, et al. "Photoacoustic clinical imaging." *Photoacoustics* 14 (2019): 77-98.

[Microchip1665XT] maXTouch 1664-node Touchscreen Controller Product Brief, Microchip, https://ww1.microchip.com/downloads/en/DeviceDoc/40001956A.pdf

What is claimed is:

1. A device, comprising a substrate and a focal plane array of pixels,
  a. wherein pixels comprise one or more transducers in one or more of the ultrasonic, electrical, optical, and thermal domains,
  b. wherein ultrasonic transducers are adapted to perform one or more of the following functions: ultrasonic transmit, ultrasonic receive, electrical transmit, electrical receive, GND electrode, by connecting their electrodes to relevant circuits using electrical switches,
  c. wherein the pixels are implemented using a complementary metal oxide semiconductor (CMOS) process,
  d. wherein the top of the substrate includes CMOS electronics,
  e. wherein optical transducer consists of one or more of a photodetector element using a semiconductor junction, or an array thereof, or a light source incident on top of the substrate, or a light source incident from the bottom of the substrate,
  f. wherein thermal transducers on the pixel consist of a temperature sensor and a local heater element.

2. The device of claim 1, wherein the substrate is made of silicon, glass, sapphire or other semiconductor materials.

3. The device of claim 1, wherein the ultrasonic transducer can be used to have ultrasonic image of the sample.

4. The device of claim 1, wherein the electrical transmit and receive circuits can be used to have the electrical impedance and capacitive image of the sample.

5. The device of claim 1, wherein the device is adapted to image the samples on the top side of the substrate in a manner where transmit and receive modalities are each picked from one or more of the following: ultrasonic, electrical, optical, thermal.

6. The device of claim 1, wherein the device is adapted to image the samples on the bottom side of the substrate in a manner where transmit and receive modalities are each picked from one or more of the following: ultrasonic, optical, thermal.

7. The device of claim 1, wherein the samples can be placed on top of the substrate by temporarily removing or folding the top light source.

8. The device of claim 1, wherein the collected data can be transferred to other electronic peripherals or to a central controller wirelessly or using wires.

9. The device of claim 1, wherein any external light source or any of the pixel transducers and their configuration can be controlled from a central unit either on the device, or off the device.

10. The device of claim 1, wherein the ultrasonic transducer electrodes are shared with electrical and capacitive transduction electrodes to allow tighter integration within the pixel or plurality of pixels.

11. The device of claim 1, wherein a sample can be viewed from a camera on the bottom side of the substrate facing the sample.

12. The device of claim 1, wherein a second substrate made of an optically transparent material is bonded on the back side of the substrate.

13. The device of claim 12, wherein the optical output of the LED lights couple to the second substrate of transparent nature and is transmitted to the sample to image it.

14. An apparatus, comprising a substrate and first and second focal plane arrays of pixels, wherein in each:
   a. pixels comprise one or more transducers in one or more of the ultrasonic, electrical, optical, and thermal domains,
   b. ultrasonic transducers are adapted to perform at least one of the following functions by connecting their electrodes to relevant circuits using electrical switches: ultrasonic transmit, ultrasonic receive, electrical transmit, electrical receive, GND electrode, by connecting their electrodes to relevant circuits using electrical switches,
   c. the pixels are implemented using a complementary metal oxide semiconductor (CMOS) process,
   d. the top of the substrate includes CMOS electronics,
   e. optical transducer consists of one or more of a photodetector element using a semiconductor junction, or an array thereof, or a light source incident on top of the substrate, or a light source incident from the bottom of the substrate,
   f. wherein thermal transducers on the pixel consist of a temperature sensor and a local heater element,
   g. wherein, the first and second focal array of pixels are positioned on top of each other facing their imaging surfaces against each other with an adjustable gap that can be used to adjust the normal force applied to any sample to be imaged in between the two devices.

15. The apparatus of claim 14, wherein all the pixels and the modality of transducers can be controlled from a single controller on or off the apparatus.

16. The apparatus of claim 14, wherein the collected sensor data can be transferred to other electronic peripherals or to a central controller wirelessly or using wires.

* * * * *